US007354698B2

(12) United States Patent
Van Santen et al.

(10) Patent No.: US 7,354,698 B2
(45) Date of Patent: Apr. 8, 2008

(54) IMPRINT LITHOGRAPHY

(75) Inventors: Helmar Van Santen, Amsterdam (NL); Aleksey Yurievich Kolesnychenko, Helmond (NL); Jacobus Hermanus Maria Neijzen, Heeze (NL); Emile Verstegen, Eindhoven (NL)

(73) Assignees: ASML Netherlands B.V., Véldhoven (NL); Koninklijke Philips Electronics N.V., Eindhoven (NL)

( * ) Notice: Subject to any disclaimer, the term of this patent is extended or adjusted under 35 U.S.C. 154(b) by 218 days.

(21) Appl. No.: 11/030,326

(22) Filed: Jan. 7, 2005

(65) Prior Publication Data

US 2006/0154179 A1 Jul. 13, 2006

(51) Int. Cl.
*G03F 7/00* (2006.01)

(52) U.S. Cl. .................. 430/311; 430/270.1; 430/322; 264/496

(58) Field of Classification Search ............. 430/270.1, 430/311, 322; 264/496
See application file for complete search history.

(56) References Cited

U.S. PATENT DOCUMENTS

| 5,091,339 | A | * | 2/1992 | Carey ........................ 216/18 |
| 5,512,131 | A | | 4/1996 | Kumar et al. ............. 156/655.1 |
| 5,772,905 | A | | 6/1998 | Chou ........................ 216/44 |
| 6,165,911 | A | | 12/2000 | Calveley ..................... 438/754 |
| 6,309,580 | B1 | | 10/2001 | Chou ........................ 264/338 |
| 6,334,960 | B1 | | 1/2002 | Willson et al. ............... 216/52 |
| 6,365,059 | B1 | | 4/2002 | Pechenik ...................... 216/52 |
| 6,375,870 | B1 | | 4/2002 | Visovsky et al. ........... 264/1.31 |
| 6,482,742 | B1 | | 11/2002 | Chou ........................ 438/690 |
| 6,518,189 | B1 | | 2/2003 | Chou ........................ 438/706 |
| 6,656,341 | B2 | | 12/2003 | Petersson et al. ........... 205/667 |
| 6,696,220 | B2 | | 2/2004 | Bailey et al. ............. 430/272.1 |
| 6,719,915 | B2 | | 4/2004 | Willson et al. ............... 216/44 |
| 6,921,615 | B2 | | 7/2005 | Sreenivasan et al. ......... 430/22 |
| 2002/0093122 | A1 | | 7/2002 | Choi et al. .................. 264/401 |
| 2002/0094496 | A1 | | 7/2002 | Choi et al. .................. 430/322 |
| 2002/0132482 | A1 | | 9/2002 | Chou ........................ 438/692 |
| 2002/0167117 | A1 | | 11/2002 | Chou ........................ 264/338 |
| 2002/0177319 | A1 | | 11/2002 | Chou ........................ 438/690 |
| 2003/0034329 | A1 | | 2/2003 | Chou ........................ 216/44 |
| 2003/0080471 | A1 | | 5/2003 | Chou ........................ 264/338 |
| 2003/0080472 | A1 | | 5/2003 | Chou ........................ 264/338 |

(Continued)

FOREIGN PATENT DOCUMENTS

WO    WO 01/79591 A1    10/2001

(Continued)

OTHER PUBLICATIONS

Stephen Y. Chou, et al., "Nanoimprint Lithography", J. Vac. Sci. Technol. B 14(6), Nov./Dec. 1996, pp. 4129-4133.

*Primary Examiner*—Amanda Walke
(74) *Attorney, Agent, or Firm*—Pillsbury Winthrop Shaw Pittman, LLP

(57) ABSTRACT

An imprinting method is disclosed which involves irradiating a photo-curable imprintable medium in a flowable state on a substrate with radiation to initiate curing of the medium, after the irradiating, contacting the medium with a template to form an imprint in the medium, allowing the medium to substantially cure such that the medium is in a substantially non-flowable state while the medium is contacted by the template, and separating the template from the medium while the medium is in the substantially non-flowable state.

71 Claims, 7 Drawing Sheets

U.S. PATENT DOCUMENTS

| | | | |
|---|---|---|---|
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0081798 A1 | 4/2004 | Lee et al. | 428/141 |
| 2004/0124566 A1 | 7/2004 | Sreenivasan et al. | 264/494 |
| 2004/0126547 A1* | 7/2004 | Coomer | 428/209 |
| 2004/0149367 A1 | 8/2004 | Olsson et al. | 156/64 |
| 2004/0169003 A1 | 9/2004 | Lee et al. | 216/4 |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0039618 A1 | 2/2005 | Heidari et al. | 101/368 |
| 2005/0064054 A1 | 3/2005 | Kasumi | 425/112 |

FOREIGN PATENT DOCUMENTS

WO     WO 01/79592 A1     10/2001

* cited by examiner

IMPRINT LITHOGRAPHY

FIELD

The invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of a short wavelength. However, there are problems associated with such reductions. Lithographic apparatus using 193 nm wavelength radiation are starting to be adopted but even at this level, diffraction limitations may become a barrier. At lower wavelengths, the transparency of projection system materials is poor. Thus, optical lithography capable of enhanced resolution will likely require complex optics and rare materials and thus will be expensive.

An alternative method to printing sub-100 nm features, known as imprint lithography, comprises transferring a pattern to a substrate by imprinting a pattern into an imprintable medium using a physical mold or template. The imprintable medium may be the substrate or a material coated onto a surface of the substrate. The imprintable medium may be functional or may be used as a "mask" to transfer a pattern to an underlying surface. The imprintable medium may, for instance, be provided as a resist deposited on a substrate, such as a semiconductor material, to which the pattern defined by the template is to be transferred. Imprint lithography is thus essentially a moulding process on a micrometer or nanometer scale in which the topography of a template defines the patterns created on a substrate. Patterns may be layered as with optical lithography processes so that in principle imprint lithography could be used for such applications as integrated circuit manufacture.

The resolution of imprint lithography is limited only by the resolution of the template fabrication process. For instance, imprint lithography has been used to produce features in the sub-50 nm range with good resolution and line edge roughness. In addition, imprint processes may not require the expensive optics, advanced illumination sources or specialized resist materials typically required for optical lithography processes.

SUMMARY

According to an aspect of the invention, there is provided an imprinting method, comprising:

irradiating a photo-curable imprintable medium in a flowable state on a substrate with radiation to initiate curing of the medium;

after the irradiating, contacting the medium with a template to form an imprint in the medium;

allowing the medium to substantially cure such that the medium is in a substantially non-flowable state while the medium is contacted by the template; and separating the template from the medium while the medium is in the substantially non-flowable state.

Thus, the curable medium is irradiated with radiation to initiate curing before being contacted with the template rather than, for example, during contacting of the medium with the template. In this way, the template may be made from a non-photo-transparent material, thus enabling a range of different materials to be used which may exhibit properties more well suited to a given application, such as improved wear resistance or reduced sticking during separation of the template from the imprinted medium. Additionally, by not being limited to using a photo-transparent material (e.g., quartz), a template for use in an embodiment of the method may be manufactured from more easily patterned materials.

In an embodiment, the method may further comprise providing a volume of the photo-curable imprintable medium in a flowable state on the substrate.

In an embodiment, a minimum dose of radiation to which the imprintable medium is exposed is a sufficient dose to make the curing process proceed. In an embodiment, the medium is irradiated with radiation for less than 1 minute, less than 30 seconds or less than 15 seconds. In an embodiment, the radiation is UV radiation. In an embodiment, the radiation has a wavelength of less than 430 nm, less than 400 nm or between 300 and 400 nm. The radiation may be provided in multiple pulses or in a single pulse.

In an embodiment, the medium is in a substantially liquid phase when the template initially contacts the medium. In an embodiment, the medium is contacted by the template for up to 5 minutes, up to 3 minutes or up to 1 minute to enable the medium to cure sufficiently so that the pattern is accurately transferred and retained in the medium following separation of the template from the medium. The medium may be in a substantially solid phase immediately before the template is separated from the medium. For example, the medium may be in a solid phase up to 5 minutes, up to 3 minutes or up to 1 minute before the template is separated from the medium.

In an embodiment, the medium is dispensed as a flowable droplet onto the substrate. This embodiment may be employed in a drop on demand process. Since this embodiment of the method is based on the concept of irradiation of the photo-curable medium before imprinting and suitable for use in a drop on demand process, an embodiment of the method be considered a modified step and flash imprint lithography (SFIL) process. The substrate may be patterned in small steps by printing small target areas of the substrate one at a time by 'flashing' the curable medium with radiation, imprinting the template into the partially cured medium, removing the template, stepping to an adjacent region of the substrate and repeating the operation. An embodiment of the method should therefore be suited to manufacture of devices requiring high overlay accuracy. In certain applications, the medium may be provided on the substrate by a method selected from a group consisting of casting, spray coating and spin coating. When appropriate, the medium may be provided as liquid streaks. When spin coating is used it will be appreciated that the medium will generally be provided as a thin layer.

A pressure of less than 1 Mpa, less than 0.5 Mpa or less than 0.1 MPa may be applied to the template during contacting the medium with the template. In an embodiment, a pressure in the range of 10 to 100 kPa, 30 to 80 kPa, and 50 to 60 kPa is applied to the template during contacting the medium with the template. Since many photo-curable materials exhibit low viscosities, a relatively low pressure may be used to imprint the medium thereby avoiding deformation of the medium and/or substrate caused by using an undesirably high pressure.

In an embodiment, the method further comprises heating the imprintable medium. Heating may be applied at any suitable time and at any desirable rate. For example, the medium may be heated while it is being contacted by the template so as to cause the temperature of the medium to increase by up to around 50° C., up to around 30° C. or up to around 10° C. Heat treatment may be applied to aid, or ensure full, curing of the medium prior to separation of the template from the medium.

In an embodiment, the humidity and/or oxygen concentration in the atmosphere adjacent to the imprintable medium may be controlled.

In an embodiment, contacting the imprintable medium with the template may form an area of reduced thickness in the imprintable medium and the method may further comprise etching the area of reduced thickness to expose a region of a surface of the substrate. In an embodiment, the method further comprises etching the exposed region of the surface of the substrate.

In an embodiment, an intermediate layer, such as a planarization layer, is provided between the substrate and the imprintable medium. In an embodiment, contacting the imprintable medium with the template forms an area of reduced thickness in the imprintable medium and the method further comprises etching the area of reduced thickness to expose a region of a surface of the intermediate layer. Appropriately, the method may further comprise etching the exposed region of the surface of the intermediate layer to expose a region of a surface of the substrate. Conveniently, the method may further comprise etching the exposed region of the surface of the substrate.

In an embodiment, the template is made from a non-photo-transparent material.

According to an aspect of the invention, there is provided an imprinting apparatus, comprising:

a substrate holder configured to hold a substrate having a photo-curable imprintable medium in a flowable state thereon;

irradiation apparatus configured to irradiate the medium with radiation to initiate curing of the medium when the medium is on the substrate;

a template holder configured to hold a non-photo-transparent template; and a controller configured to cause the non-photo-transparent template to contact the medium, after irradiation of the medium, to form an imprint in the medium and to cause the template to separate from the medium after the medium has been allowed to substantially cure such that the medium is in a substantially non-flowable state.

In an embodiment, the apparatus further comprises a dosing apparatus configured to provide a volume of the photo-curable imprintable medium in a flowable state onto a substrate supported on the substrate holder.

In an embodiment, the dosing apparatus is configured to deposit a first volume of the medium onto a first target portion of the substrate. Thus, the apparatus may be employed in a drop on demand process.

In an embodiment, the dosing apparatus is configured to, following imprinting of the first volume of the medium, deposit a second volume of the medium onto a second target portion of the substrate which is spaced from the first target portion and the template holder is configured to imprint the second volume of the medium. In this way, the apparatus may be used in a modified step and flash imprint lithography (SFIL) process where the flash step is carried out before the template contacts the imprintable medium.

According to an aspect of the invention, there is provided an imprinting apparatus, comprising:

a substrate holder configured to hold a substrate having first and second volumes of a photo-curable imprintable medium in a flowable state on respective first and second spaced target portions of the substrate;

irradiation apparatus configured to sequentially irradiate the first and second volumes with radiation to initiate curing of the first and second volumes respectively when the first and second volumes are on the substrate;

a template holder configured to hold a template; and a controller configured to cause the template to contact the first volume after irradiation of the first volume and during irradiation of the second volume to form an imprint in the first volume and to cause the template to separate from the first volume after the first volume has been allowed to substantially cure such that the first volume is in a substantially non-flowable state.

This apparatus may allow a series of volumes of an imprintable medium deposited on target portions of the substrate to be sequentially irradiated and imprinted. Operating the template holder such that the template imprints a particular volume of imprintable medium while the irradiation apparatus simultaneously irradiates a different volume ready for imprinting may increase the overall rate of the process.

In an embodiment, the apparatus further comprises a dosing apparatus configured to provide the first and second volumes of a photo-curable imprintable medium in a flowable state on respective first and second spaced target portions of a substrate supported on the substrate holder.

The features set out above in relation to an embodiment of the method may be applied to one or more embodiments of the apparatus described herein.

According to an aspect of the invention, there is provided a method for patterning a substrate, comprising:

irradiating a photo-curable etch barrier material in a flowable state on a substrate with radiation to initiate curing of the etch barrier material;

after irradiating the etch barrier, contacting the etch barrier material with a template to form a pattern comprising an area of reduced thickness in the etch barrier material;

allowing the etch barrier material to substantially cure such that the etch barrier material is in a substantially non-flowable state while the etch barrier material is contacted by the template;

separating the template from the etch barrier material while the etch barrier material is in the substantially non-flowable state;

etching the area of reduced thickness to expose an exposed region of a surface of the substrate; and etching the exposed region of the surface of the substrate.

In an embodiment, the minimum dose of radiation to which the imprintable medium is exposed is a sufficient dose to make the curing process proceed. In an embodiment, the etch barrier material is irradiated with radiation for less than 1 minute, less than 30 seconds or less than 15 seconds. In an embodiment, the radiation is UV radiation. In an embodiment, the radiation has a wavelength of less than 430 nm, less than 400 nm or between 300 and 400 nm. The radiation may be provided in multiple pulses or in a single pulse.

In an embodiment, the etch barrier material is in a substantially liquid phase when the template initially contacts the etch barrier material. In an embodiment, the medium is contacted by the template for up to 5 minutes, up to 3 minutes or up to 1 minute to enable the medium to cure sufficiently so that the pattern is accurately transferred and retained in the medium following separation of the template from the medium. The etch barrier material may be in a substantially solid phase immediately before the template is separated from the etch barrier material. For example, the etch barrier material may be in a solid phase up to 5 minutes, up to 3 minutes or up to 1 minute before the template is separated from the etch barrier material.

In an embodiment, the etch barrier material is dispensed as a flowable droplet onto the substrate. This embodiment may therefore be employed in a drop on demand process allowing this embodiment to be considered as a modified step and flash imprint lithography (SFIL) process. As discussed above, the substrate may be patterned in small steps by printing small target areas of the substrate one at a time by 'flashing' the curable etch barrier material with radiation, imprinting the template into the partially cured etch barrier material, removing the template, stepping to an adjacent region of the substrate and repeating the operation. In certain applications, the etch barrier material may be provided on the substrate by a method selected from a group consisting of casting, spray coating and spin coating. When appropriate, the medium may be provided as liquid streaks. When spin coating is used it will be appreciated that the medium will generally be provided as a thin layer.

A pressure of less than 1 Mpa, less than 0.5 Mpa or less than 0.1 MPa may be applied to the template during contacting the etch barrier material with the template. In an embodiment, a pressure in the range of 10 to 100 kPa, 30 to 80 kPa, or 50 to 60 kPa is applied to the template during contacting the etch barrier material with the template. Since many photo-curable materials exhibit low viscosities, a relatively low pressure may be used to imprint the etch barrier material thereby avoiding deformation of the etch barrier material and/or substrate caused by using an undesirably high pressure.

In an embodiment, the method further comprises heating the etch barrier material. Heating may be applied at any suitable time and at any desirable rate. For example, the etch barrier material may be heated while it is being contacted by the template so as to cause the temperature of the etch barrier material to increase by up to around 50° C., up to around 30° C. or up to around 10° C. Heat treatment may be applied to aid, or ensure full, curing of the etch barrier material prior to separation of the template from the of the template from the etch barrier material.

In an embodiment, the template is made from a non-photo-transparent material.

In an embodiment, the humidity and/or oxygen concentration in the atmosphere adjacent to the etch barrier material is controlled.

The apparatus described may be suitable for carrying out the above-described method simply by making routine modifications to the apparatus to enable etching of the area(s) of reduced thickness in the etch barrier material and the exposed regions of the surface of the substrate.

The following description sets out features of the imprintable medium defined above but is also relevant to features of the etch barrier material defined above. Thus, in the following description, the term 'imprintable medium' will be used to refer generically to the imprintable medium and the etch barrier material.

In an embodiment, the imprintable medium has a viscosity of less than 100 cps, less than 70 cps or less than 10 cps, when measured at 25° C. An advantage of using photo-curable imprintable media is that many of them exhibit relatively low viscosities which is desirable in imprintable media, such as etch barrier materials, since it facilitates the use of a relatively low printing pressure.

In an embodiment, the imprintable medium should exhibit an appropriate degree of etch resistance during the etching step(s), which will be at least partially dependent upon the etch conditions used in a particular process. Thus, in an embodiment, the imprintable medium comprises silicon containing groups.

In an embodiment, the photo-curable monomer is cured by photo-induced chemical cross linking. Accordingly, the photo-curable monomer may be a photo-activated cross linkable polymer.

In an embodiment, the imprintable medium comprises a photo-polymerizable monomer, which may be a cationically polymerizable monomer. In an embodiment, the cationically polymerizable monomer contains first and second polymerizable groups. The polymerizable groups may be provided at any desirable relative orientation within the monomer structure. In an embodiment, the first polymerizable group or the second polymerizable group is selected from a group consisting of an epoxide group, an oxetane group, an ether group and a vinyl group. The ether group may be selected from the group consisting of an aliphatic ether group, an aromatic ether group and a cyclic ether group. By way of example, the cationically polymerizable monomer may be diglycidylether of bisphenol-A.

In an embodiment, the imprintable medium further comprises a polymerization initiator species. The polymerization initiator species may be a Lewis acid and may be a salt. Appropriately, the salt may contain a phenyl group. The salt may be selected from the group consisting of a diphenyliodium salt and a tripheylsulfonium salt.

In an embodiment, the imprintable medium further comprises a polymerization rate modifying species, which may be a polymerization accelerant which accelerates the rate of polymerization. In this case, the polymerization accelerant may contain an aromatic group. For example, the polymerization accelerant may be selected from a group consisting of anthracene and thioxanthone.

In an embodiment, the photo-polymerizable monomer is a free radical polymerizable monomer, which may contain first and second polymerizable groups. In an embodiment, the first polymerizable group or the second polymerizable group is selected from a group consisting of a carboxylic acid group, an ester group, and a vinyl group. The free radical polymerizable monomer may be selected from the group consisting of an acrylate, a methacrylate and a vinyl monomer. For example, the free radical polymerizable monomer may be 2,2-bis[4-(2-hydroxy-3-acryloylpropoxy) phenyl]propane.

In an embodiment, the imprintable medium further comprises a polymerization initiator species. The polymerization initiator species may be activatable at low to medium temperatures, such as temperatures around standard room temperature or slightly higher, for example, low to medium temperatures may be taken to include temperatures in the range of 10 to 100° C., 20 to 80° C. or 30 to 70° C.

In an embodiment, the polymerization initiator species contains an azo group. Additionally or alternatively, the polymerization initiator species may contain an ester group. For example, the polymerization initiator species may be azobisisobutyronitrile.

The polymerization initiator species may be activatable at high temperatures, e.g. temperatures above 100° C. or above 150° C., in which case the polymerization initiator species may contain a chemical group selected from a group consisting of a ketone group and a ketal group. More specifically, the polymerization initiator species may contain a chemical group selected from a group consisting of an α-hydroxy-ketone group, an α-amino-ketone group and a benzyldimethyl-ketal. Yet more specifically, the polymerization initiator species may be dimethoxy-α-phenyl-acetophenone.

In an embodiment, the imprintable medium further comprises a polymerization rate modifying species, which may be a polymerization decelerant which decelerates the rate of polymerization. Advantageously, the polymerization decelerant may contain a single polymerizable group, thereby inherently impeding polymerization. An example of such species is t-butyl phenyl glycidyl ether, and methylmethacrylate. Another rate modifying species, specifically for retarding free radical polymerization is a compound intrinsically having a free radical. Accordingly, the polymerization decelerant may contain a single free radical polymerizable group. Such compounds will couple with irradiation created free radicals from the photo-initiator until all the compound is coupled. An example of such a compound is the tetramethylpyridinyl-oxy-radical.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
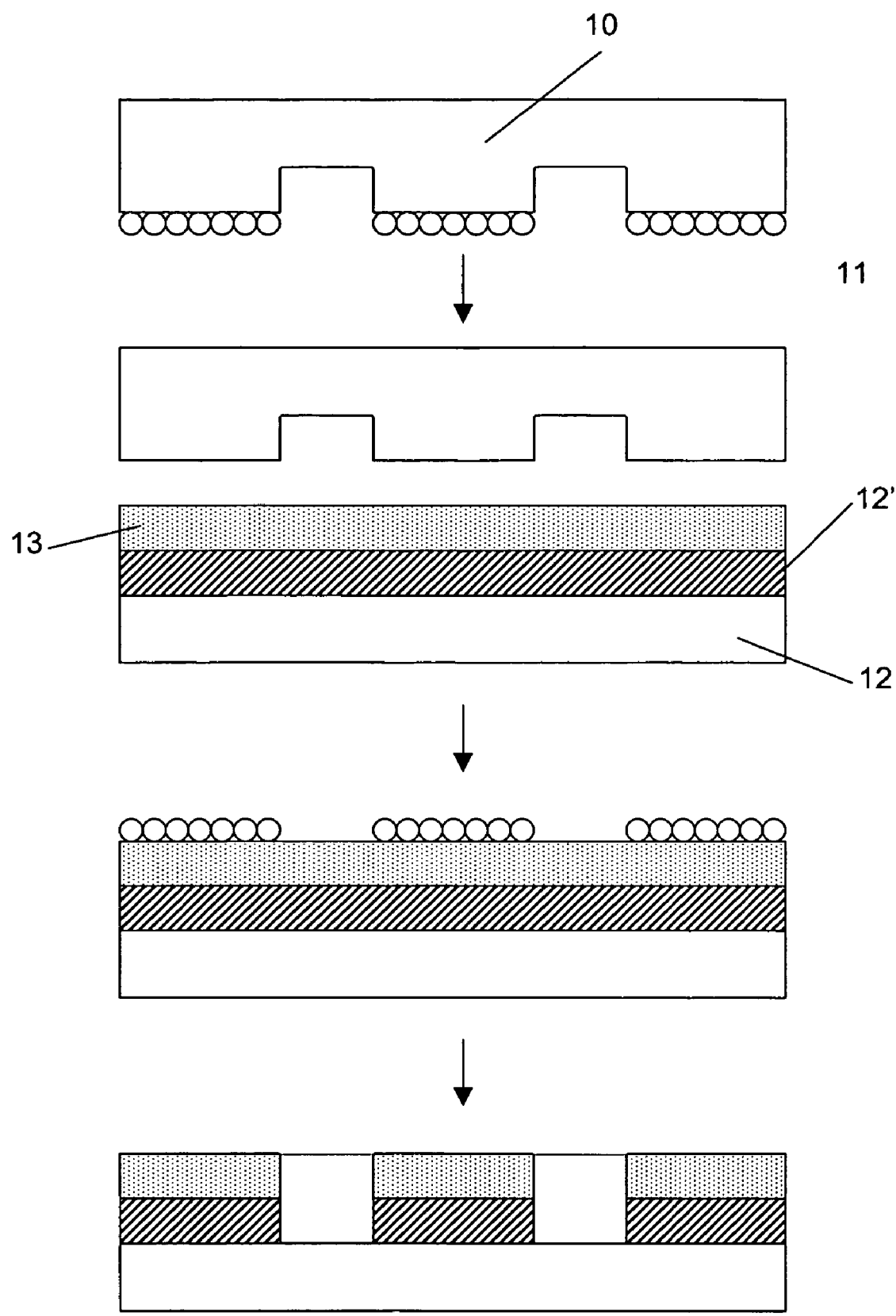
FIGS. 1a-1c illustrate examples of conventional soft, hot and UV lithography process respectively.
Figure 1B:
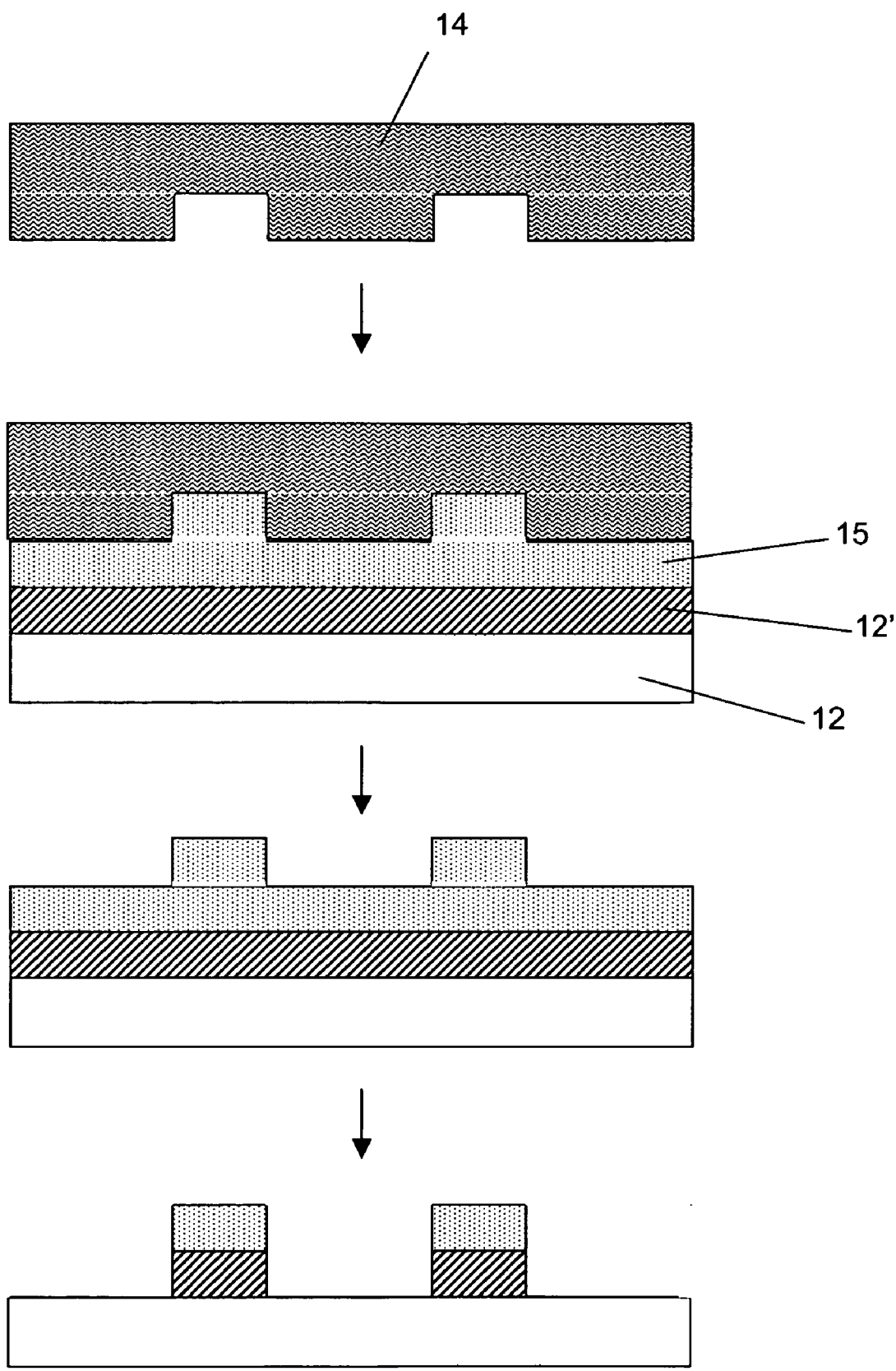
Figure 1C:
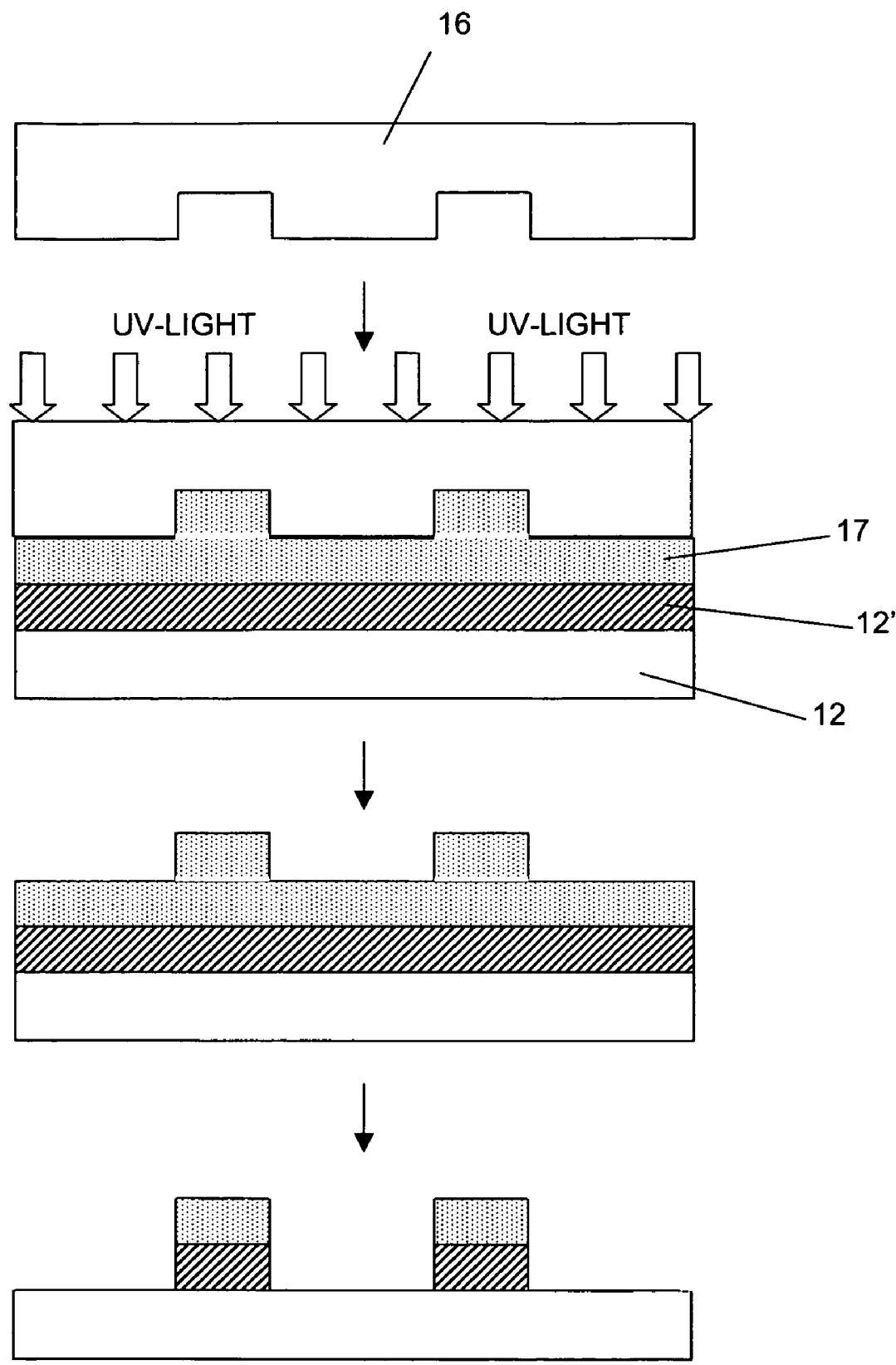

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of substrate. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly(methyl methacrylate), polystyrene, poly(benzyl methacrylate) or poly(cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
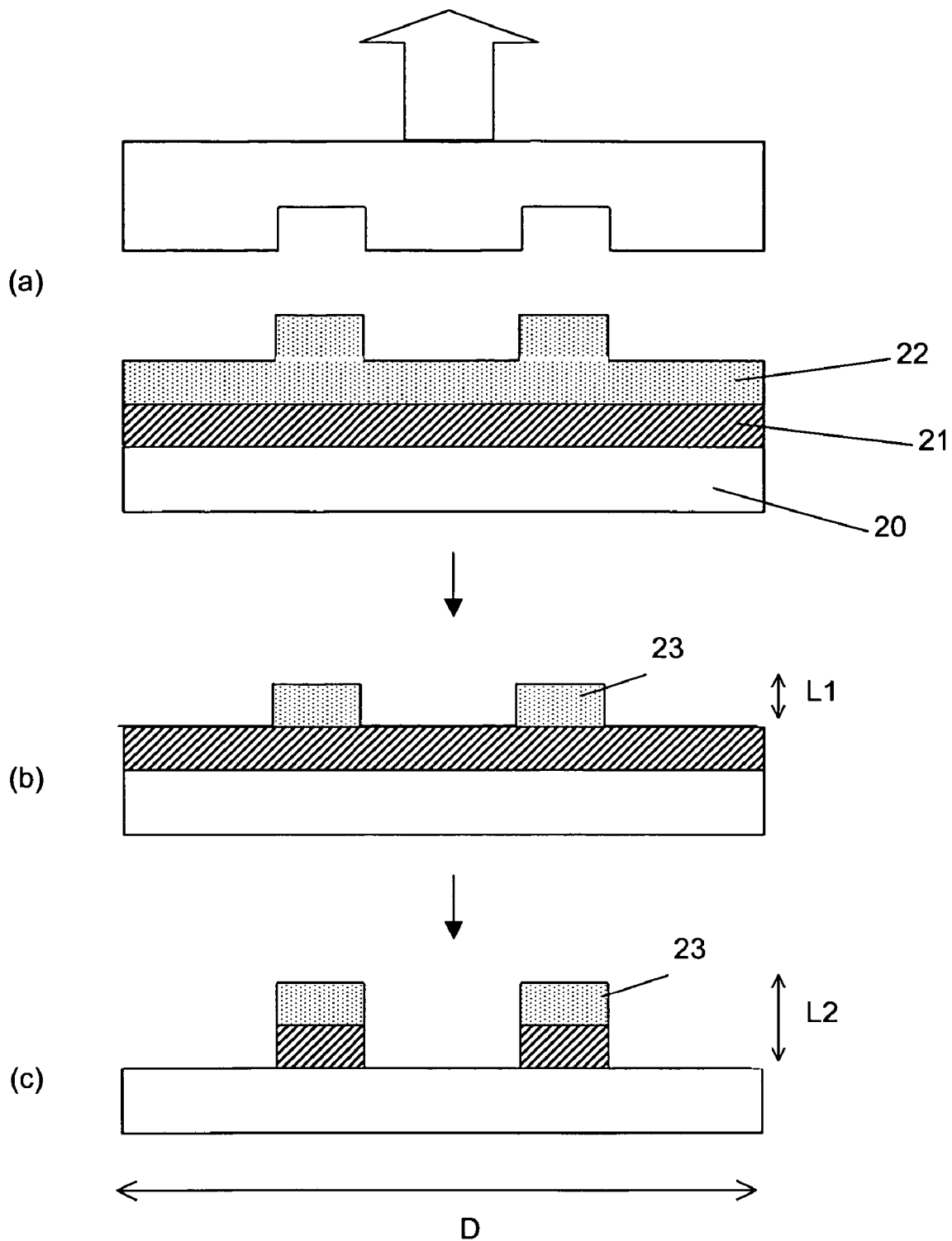
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as will be described below.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. This may be exacerbated by the relatively high pressure required for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylatee. In general, any photopolymerizable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described above. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description above, and below, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch the resin will have nowhere to flow. One or more problems associated with overly thick or uneven residual layer are discussed below.

Although reference is made above to depositing UV curable liquids onto a substrate, the liquids could also be deposited on the template and in general the same techniques and considerations will apply.

Figure 3:
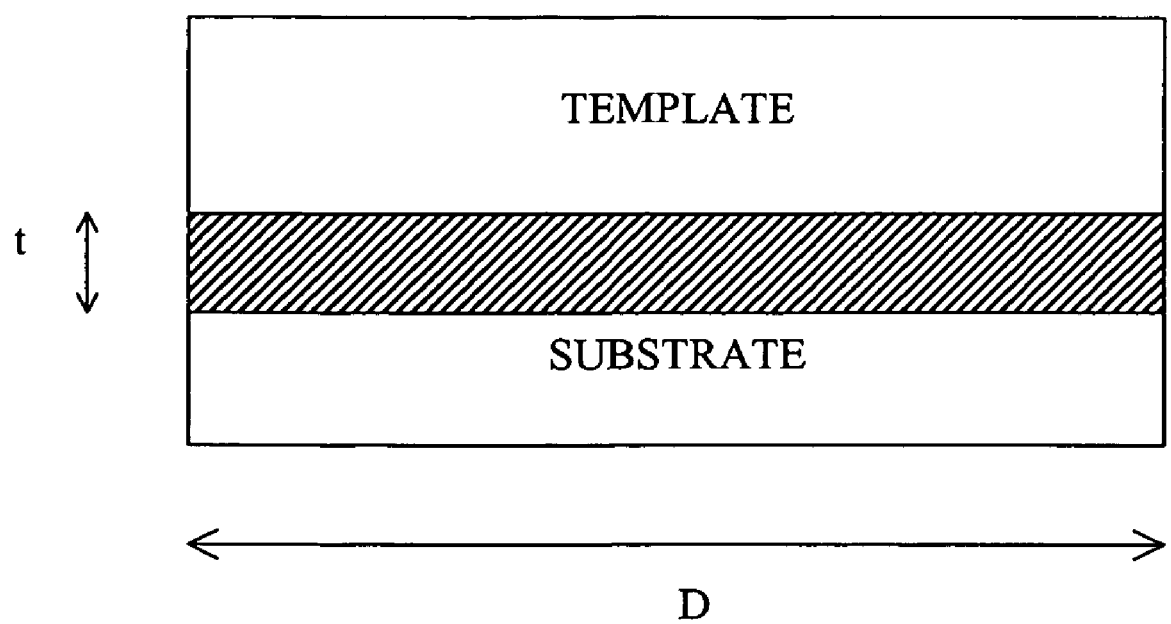
FIG. 3 illustrates relative dimensions of template features compared to the thickness of a typical imprintable resist volume deposited on a substrate.

FIG. 3 illustrates the relative dimensions of the template, imprintable material (curable monomer, thermosetting resin, thermoplastic, etc.), and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer of imprintable material left after stamping is useful in protecting the underlying substrate, but may also impact obtaining high resolution and/or overlay accuracy. The first 'breakthrough' etch is isotropic (non-selective) and will thus to some extent erode the features imprinted as well as the residual layer. This may be exacerbated if the residual layer is overly thick and/or uneven.

This etching may, for instance, lead to a variation in the thickness of features ultimately formed on the underlying substrate (i.e. variation in the critical dimension). The uniformity of the thickness of a feature that is etched in the transfer layer in the second anisotropic etch is dependant upon the aspect ratio and integrity of the shape of the feature left in the resin. If the residual resin layer is uneven, then the non-selective first etch may leave some of these features with "rounded" tops so that they are not sufficiently well defined to ensure good uniformity of feature thickness in the second and any subsequent etch process.

In principle, the above problem may be reduced by ensuring the residual layer is as thin as possible but this may require application of undesirably large pressures (possibly increasing substrate deformation) and relatively long imprinting times (perhaps reducing throughput).

As noted above, the resolution of the features on the template surface is a limiting factor on the attainable resolution of features printed on the substrate. The templates used for hot and UV imprint lithography are generally formed in a two-stage process. Initially, the required pattern is written using, for example, electron beam writing to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be desired as the template is effectively a 1× mask with the resolution of the transferred pattern being limited by the resolution of the pattern on the template.

The release characteristics of the template are also a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the imprintable medium, and in the case of hot imprint lithography, it may also be subjected to high pressure and temperature. The force, pressure and/or temperature may cause wearing of the template, and may adversely affect the shape of the pattern imprinted upon the substrate.

In hot imprint lithography, a potential advantage may be realized in using a template of the same or similar material to the substrate to be patterned in order to help reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disk magnetic media, flat panel displays, thin-film magnetic heads, etc.

While in the description above particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non linear response, etc. For example, the functional material may form a conductive layer, a semiconductive layer, a dielectric layer or a layer having another desirable mechanical, electrical or optical property. Some organic substances may also be appropriate functional materials. Such applications may be within the scope of one or more embodiments of the invention.

As mentioned above, photo (e.g. UV) imprint lithography may suffer from one or more problems. For example, processes employing a photo-curable material offers relatively low throughput due to the relatively long polymerization time. The use of a photo-transparent template may limit the materials from which the template can be made. At present quartz is used, however, other non-photo-transparent materials are known to exhibit improved wear resistance and/or reduced tendency to stick to the imprintable medium during separation.

Figure 4A:
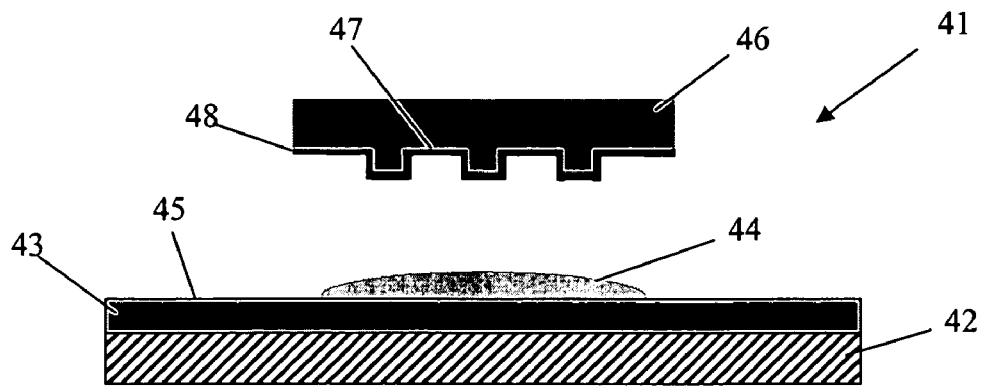
FIGS. 4a-d are schematic representations of the initial four steps involved in a method in accordance with the invention to provide a patterned substrate.

FIG. 4a shows the various components of an imprinting system 41 for use in a method in accordance with an embodiment of the invention. A silicon substrate 42 supports a planarization layer 43. A droplet of TV curable methacrylate monomer 44 has been deposited onto a surface 45 of the planarization layer 43 to act as an imprintable medium (e.g., imprintable etch barrier). Positioned above the methacrylate monomer 44 is a template 46 with a lower surface 47 which defines a relief pattern. A release layer 48 is coated on the surface 47 of the template 46 defining the relief pattern to aid separation of the template 46 from the methacrylate monomer 44 following formation of the pattern in the methacrylate monomer 44.

Figure 4B:
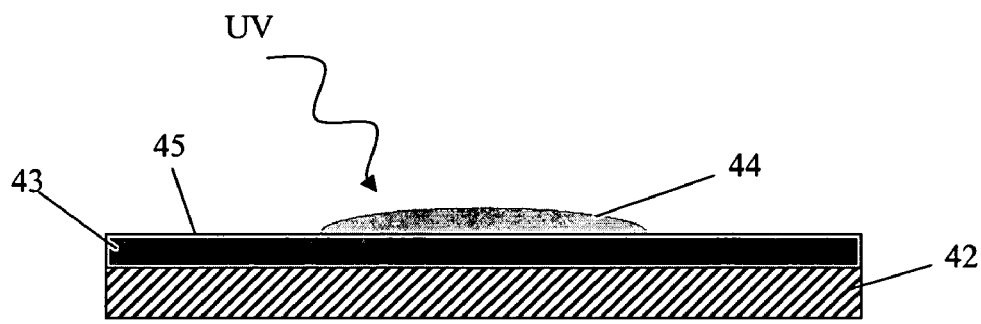

In FIG. 4b, the methacrylate monomer 44 is irradiated with UV radiation to initiate polymerization and curing. A controller (of any kind now or hereafter known to the skilled person) may control the initiation and timing of the irradiation. In an embodiment, the controller may be a software program provide in or controlling the imprinting apparatus.

Figure 4C:
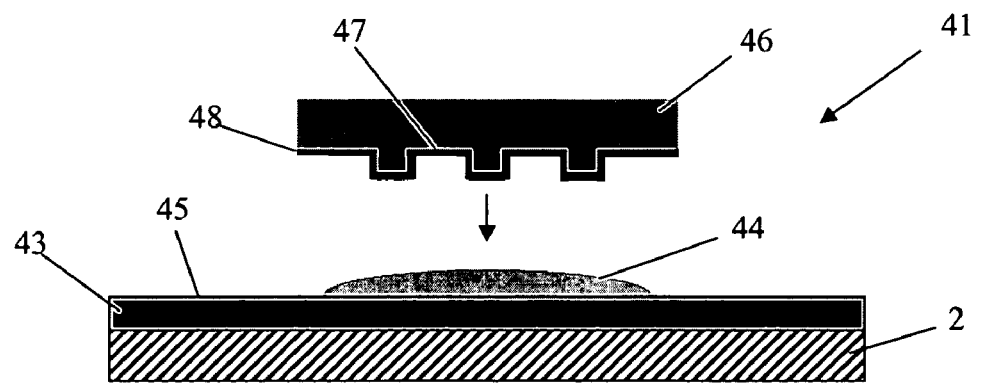

In FIG. 4c, the partially cured methacrylate monomer 44 is contacted and imprinted by the surface 47 of the template 46 defining the relief pattern so that the desired pattern is formed in the methacrylate monomer 44. Again, a controller may control the initiation and timing of the imprinting of the surface.

Figure 4D:
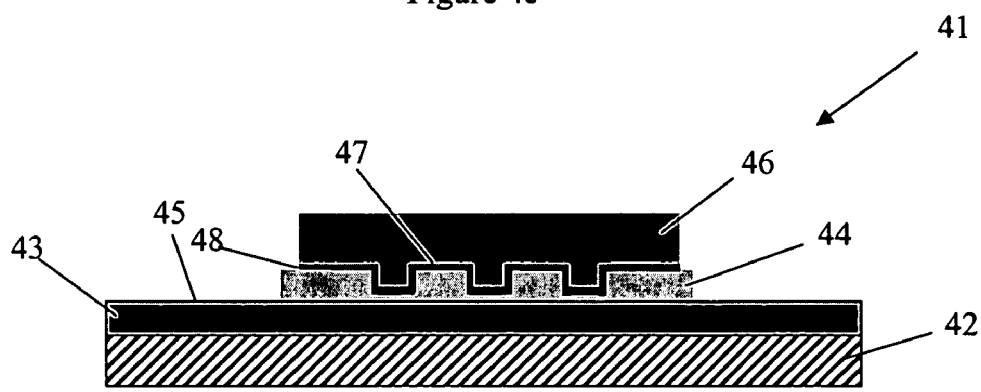

In FIG. 4d, the template 46 is retained in contact with the methacrylate monomer 44 to allow the methacrylate monomer 44 sufficient time to cure and solidify. In this way, the methacrylate monomer 44 will retain the imprinted pattern.

Figure 5A:
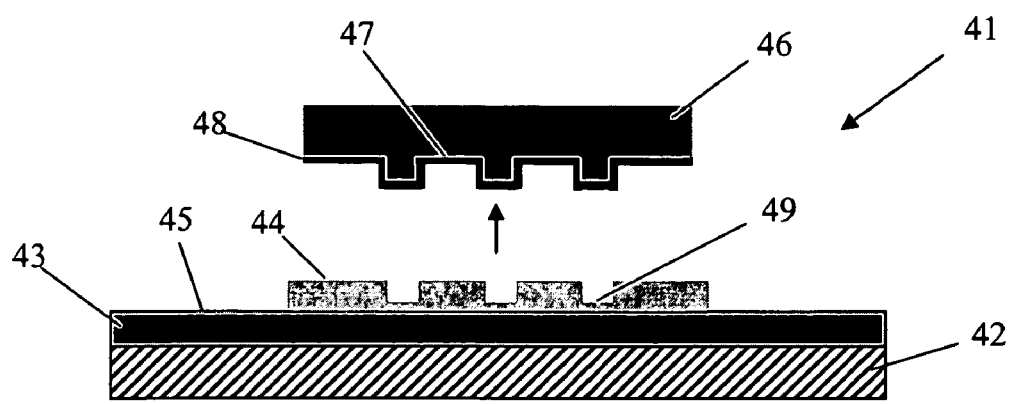
FIGS. 5a-d are schematic representations of the final four steps involved in a method in accordance with the invention to provide a patterned substrate.

In FIG. 5a, the template 46 and release layer 48 are separated from the solidified methacrylate monomer 44 leaving areas of reduced thickness 49 in the methacrylate monomer 44 adjacent the surface 45 of the planarization layer 43. A controller may control the initiation and timing of the separation of the template from the surface.

Figure 5B:
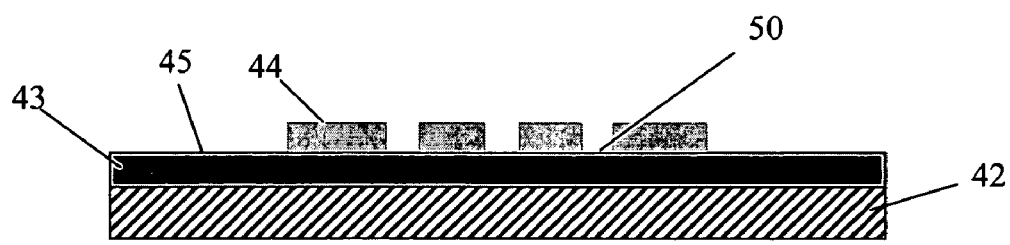
Figure 5C:
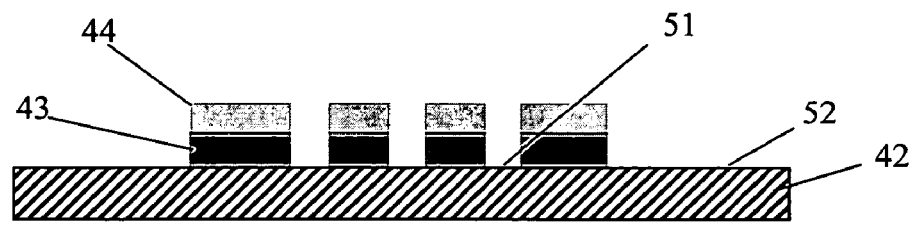
Figure 5D:
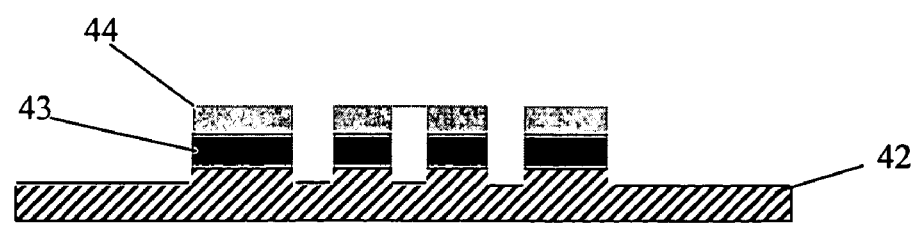

FIG. 5b shows a first etching process to remove the areas of reduced thickness 49 in the solidified methacrylate monomer 44 thereby exposing regions 50 of the surface 45 the planarization layer 43. In FIG. 5c, the exposed regions 50 of the surface 45 of the planarization layer 43 are etched to expose regions 51 of a surface 52 of the substrate 42. In FIG. 5d, the exposed regions 51 of the surface 52 of the substrate are etched to provide the desired pattern in the substrate 42.

The process represented by FIGS. 4 and 5 may be repeated any desirable number of times in a step and repeat process in which a series of droplets of methacrylate monomer are deposited, irradiated and imprinted sequentially at a series of laterally spaced target locations on the substrate surface. By way of example, first and second methacrylate monomer droplets may provided adjacent one another on the substrate surface. The first droplet is irradiated with radiation to initiate curing. The irradiation apparatus is then directed to the second droplet and the adjacent second methacrylate monomer droplet is irradiated. During irradiation of the second droplet, the first droplet is contacted by the template to imprint the desired pattern. This simultaneous irradiating and contacting process can then repeated any desirable number of times and may be thought of as a modified SFIL process in which the flash is carried out before the template contacts the medium. Of course, while a method in accordance an embodiment of the invention is suitable for application in step and repeat processes, it may also be suitable for imprinting single etch barrier layers supported on a substrate.

Since curing of the imprintable medium is initiated before contacting the medium with the template, the template material may be selected to suit a given imprinting system rather than being limited to photo-transparent materials only. Moreover, the template may be fabricated from materials which are more easily patterned than quartz. A set of imprinting conditions and materials are selected which will ensure that the relief pattern defined on the template will be faithfully transferred to the imprintable medium. Thus, provided care is taken to ensure that the imprintable medium is in a sufficiently moldable or flowable state to fill the relief pattern defined in the template when the template initially contacts the medium, the fact that curing of the medium has already been initiated should not present a problem.

It will be understood that numerous modifications can be made without departing from the underlying inventive concept and that these modifications are intended to be included within the scope of the invention. For example, the imprintable medium may comprise one or more photo-curable materials in any desirable ratio. The imprintable medium may also contain one or more additives to increase or decrease the rate of polymerization. For example, methacrylates are considered as being relatively fast curing under many conditions and so if a methacrylate is to be used it may be appropriate to include an additive to slow the rate of curing to ensure that the imprintable medium is not too hard to mold into the pattern defined in the template. Additives may also be added to adjust the physical and/or chemical properties of the medium, such as viscosity. An embodiment of the invention may be applied to imprint systems using any desirable substrate material with or without a planarization layer. Moreover, the use of a release layer is not mandatory and may be omitted if appropriate. Since the template may be made from materials other than photo-transparent materials (e.g. quartz), it is envisaged that sticking of the imprintable medium to the template during separation will be reduced.

An embodiment may be suitable for the production of multilayer substrates by simply repeating the above described procedure on successive layers of substrate material. Moreover, since photo-curable materials generally exhibit low viscosities, a relatively low printing pressure may be used, which reduces the likelihood of substrate deformation during processing and thereby should improve the accuracy of pattern overlay.

While specific embodiments of the invention have been described above, it will be appreciated that the invention may be practiced otherwise than as described. The description is not intended to limit the invention.

We claim:

1. An imprinting method, comprising:
    irradiating a photo-curable imprintable medium in a flowable state on a substrate with radiation to initiate curing of the medium;
    after the irradiating, bringing into contact the medium with a template to form an imprint in the medium;
    allowing the medium to substantially cure while the medium is contacted by the template without further irradiation; and
    separating the template from the medium while the medium is in a substantially non-flowable state.

2. The method according to claim 1, further comprising providing a volume of the photo-curable imprintable medium in a flowable state on the substrate.

3. The method according to claim 1, comprising irradiating the photo-curable imprintable medium for less than 1 minute.

4. The method according to claim 1, wherein the radiation is UV radiation.

5. The method according to claim 1, wherein the radiation has a wavelength of less than 430 nm.

6. The method according to claim 1, wherein the radiation is provided in multiple pulses.

7. The method according to claim 1, wherein the radiation is provided in a single pulse.

8. The method according to claim 1, comprising depositing a first volume of the medium on a first target portion of the substrate.

9. The method according to claim 7, comprising, following imprinting of the first volume of the medium, depositing a second volume of the medium on a second target portion of the substrate which is spaced from the first target portion and imprinting the second volume of the medium.

10. The method according to claim 1, wherein the medium is in a substantially liquid phase when the template initially contacts the medium.

11. The method according to claim 1, wherein the medium is in a substantially solid phase immediately before the template is separated from the medium.

12. The method according to claim 1, comprising dispensing the medium as a flowable droplet onto the substrate.

13. The method according to claim 1, comprising applying a pressure in the range of 10 to 100 kPa to the template during bringing into contact the medium with the template.

14. The method according to claim 1, further comprising heating the imprintable medium.

15. The method according to claim 1, wherein the imprintable medium has a viscosity of less than 100 cps.

16. The method according to claim 1, wherein the imprintable medium comprises silicon containing groups.

17. The method according to claim 1, wherein the imprintable medium comprises a photo-polymerizable monomer.

18. The method according to claim 17, wherein the photo-polymerizable monomer is a cationically polymerizable monomer.

19. The method according to claim 18, wherein the cationically polymerizable monomer comprises first and second polymerizable groups.

20. The method according to claim 19, wherein the first polymerizable group or the second polymerizable group is selected from a group consisting of an epoxide group, an oxetane group, an ether group and a vinyl group.

21. The method according to claim 20, wherein the ether group is selected from the group consisting of an aliphatic ether group, an aromatic ether group and a cyclic ether group.

22. The method according to claim 18, wherein the cationically polymerizable monomer is diglycidylether of bisphenol-A.

23. The method according to claim 18, wherein the imprintable medium further comprises a polymerization initiator species.

24. The method according to claim 23, wherein the polymerization initiator species is a Lewis acid.

25. The method according to claim 24, wherein the Lewis acid is a salt.

26. The method according to claim 25, wherein the salt contains a phenyl group.

27. The method according to claim 25, wherein the salt is selected from the group consisting of a diphenyliodium salt and a triphenylsulfonium salt.

28. The method according to claim 18, wherein the imprintable medium further comprises a polymerization rate modifying species.

29. The method according to claim 28, wherein the polymerization rate modifying species is a polymerization accelerant which accelerates the rate of polymerization.

30. The method according to claim 29, wherein the polymerization accelerant comprises an aromatic group.

31. The method according to claim 29, wherein the polymerization accelerant is selected from a group consisting of anthracene and thioxanthone.

32. The method according to claim 17, wherein the photo-polymerizable monomer is a free radical polymerizable monomer.

33. The method according to claim 32, wherein the free radical polymerizable monomer contains first and second polymerizable groups.

34. The method according to claim 33, wherein the first polymerizable group or the second polymerizable group is selected from a group consisting of a carboxylic acid group, an ester group, and a vinyl group.

35. The method according to claim 32, wherein the free radical polymerizable monomer is selected from the group consisting of an acrylate, a methacrylate and a vinyl monomer.

36. The method according to claim 32, wherein the free radical polymerizable monomer is 2,2-bis[4-(2-hydroxy-3-acryloylpropoxy)phenyl]propane.

37. The method according to claim 32, wherein the imprintable medium further comprises a polymerization initiator species.

38. The method according to claim 37, wherein the polymerization initiator species is activatable at low to medium temperatures.

39. The method according to claim 38, wherein the polymerization initiator species contains an azo group.

40. The method according to claim 38, wherein the polymerization initiator species contains an ester group.

41. The method according to claim 38, wherein the polymerization initiator species is azobisisobutyronitrile.

42. The method according to claim 37, wherein the polymerization initiator species is activatable at high temperatures.

43. The method according to claim 42, wherein the polymerization initiator species contains a chemical group selected from a group consisting of a ketone group and a ketal group.

44. The method according to claim 42, wherein the polymerization initiator species contains a chemical group selected from a group consisting of an α-hydroxy-ketone group, an α-amino-ketone group and a benzyldimethyl-ketal.

45. The method according to claim 42, wherein the polymerization initiator species is dimethoxy-α-phenyl-acetophenone.

46. The method according to claim 32, wherein the imprintable medium further comprises a polymerization rate modifying species.

47. The method according to claim 46, wherein the polymerization rate modifying species is a polymerization decelerant which decelerates the rate of polymerization.

48. The method according to claim 47, wherein the polymerization decelerant contains a single polymerizable group.

49. The method according to claim 47, wherein the polymerization decelerant contains a single free radical polymerizable group.

50. The method according to claim 1, wherein bringing into contact the imprintable medium with the template forms an area of reduced thickness in the imprintable medium and further comprising etching the reduced thickness to expose a region of a surface of the substrate.

51. The method according to claim 50, further comprising etching the exposed region of the surface of the substrate.

52. The method according to claim 1, wherein an intermediate layer is provided between the substrate and the imprintable medium.

53. The method according to claim 52, wherein bringing into contact the imprintable medium with the template forms an area of reduced thickness in the imprintable medium and further comprising etching the area of reduced thickness to expose a region of a surface of the intermediate layer.

54. The method according to claim 53, further comprising etching the exposed region of the surface of the intermediate layer to expose a region of a surface of the substrate.

55. The method according to claim 54, further comprising etching the exposed region of the surface of the substrate.

56. The method according to claim 1, wherein the template is made from a non-photo-transparent material.

57. A method for patterning a substrate, comprising:
  irradiating a photo-curable etch barrier material in a flowable state on a substrate with radiation to initiate curing of the etch barrier material;
  after irradiating the etch barrier, bringing into contact the etch barrier material with a template to form a pattern comprising an area of reduced thickness in the etch barrier material;
  allowing the etch barrier material to substantially cure while the etch barrier material is contacted by the template without further irradiation;
  separating the template from the etch barrier material while the etch barrier material is in a substantially non-flowable state;
  etching the area of reduced thickness to expose an exposed region of a surface of the substrate; and
  etching the exposed region of the surface of the substrate.

58. The method according to claim 57, further comprising providing a volume of the photo-curable etch barrier material in a flowable state on the substrate.

59. The method according to claim 57, comprising irradiating the etch barrier material for less than 1 minute.

60. The method according to claim 57, wherein the radiation is UV radiation.

61. The method according to claim 57, wherein the radiation has a wavelength of less than 430 nm.

62. The method according to claim 57, wherein the radiation is provided in multiple pulses.

63. The method according to claim 57, wherein the radiation is provided in a single pulse.

64. The method according to claim 57, comprising depositing a first volume of the etch barrier material on a first target portion of the substrate.

65. The method according to claim 64, comprising, following etching of the surface of the first target portion of the substrate, depositing a second volume of the etch barrier material on a second target portion of the substrate which is spaced from the first target portion and comprising etching the surface of the second target portion of the substrate.

66. The method according to claim 57, wherein the etch barrier material is in a substantially liquid phase when the template initially contacts the etch barrier material.

67. The method according to claim 57, wherein the etch barrier material is in a substantially solid phase immediately before the template is separated from the etch barrier material.

68. The method according to claim 57, comprising dispensing the etch barrier material as a flowable droplet onto the substrate.

69. The method according to claim 57, comprising applying a pressure in the range of 10 to 100 kPa to the template during bringing into contact the etch barrier material with the template.

70. The method according to claim 57, further comprising heating the etch barrier material.

71. The method according to claim 57, wherein the template is made from a non-photo-transparent material.

* * * * *